United States Patent
Katayama et al.

(10) Patent No.: US 6,584,015 B2
(45) Date of Patent: Jun. 24, 2003

(54) STORAGE DEVICE COUNTING ERROR CORRECTION

(75) Inventors: Kunihiro Katayama, Chigasaki (JP); Takayuki Tamura, Yokohama (JP); Yusuke Jono, Higashiyamato (JP); Motoki Kanamori, Tachikawa (JP); Atsushi Shikata, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/246,694

(22) Filed: Sep. 19, 2002

(65) Prior Publication Data

US 2003/0021151 A1 Jan. 30, 2003

Related U.S. Application Data

(63) Continuation of application No. 10/020,223, filed on Dec. 18, 2001, now Pat. No. 6,480,416, and a continuation of application No. 09/662,926, filed on Sep. 15, 2000, now Pat. No. 6,339,546.

(30) Foreign Application Priority Data

Sep. 17, 1999 (JP) .............................................. 11-263156

(51) Int. Cl.⁷ ............................................... G11C 16/04
(52) U.S. Cl. ............................. 365/185.11; 365/185.04
(58) Field of Search ....................... 365/185.11, 185.09, 365/185.04, 185.33

(56) References Cited

U.S. PATENT DOCUMENTS

| | | | |
|---|---|---|---|
| 5,394,525 A | 2/1995 | Kuwana et al. | |
| 5,406,529 A | * 4/1995 | Asano | 365/185.11 |
| 5,436,917 A | 7/1995 | Karasawa | |
| 5,568,439 A | 10/1996 | Harari | |
| 5,673,383 A | 9/1997 | Sukegawa | |
| 5,715,193 A | 2/1998 | Norman | |
| 6,058,047 A | 5/2000 | Kikuchi | |
| 6,078,520 A | * 6/2000 | Tobita et al. | 365/185.09 |
| 6,151,246 A | 11/2000 | So et al. | |

FOREIGN PATENT DOCUMENTS

| | | |
|---|---|---|
| GB | 2254173 | 9/1992 |
| JP | 4163966 | 6/1992 |
| JP | 667816 | 3/1994 |
| JP | 1153266 | 2/1999 |

* cited by examiner

*Primary Examiner*—Huan Hoang
(74) *Attorney, Agent, or Firm*—Antonelli, Terry, Stout & Kraus, LLP

(57) ABSTRACT

A semiconductor storage device that determines the cause of an error at the time of the error correction of data read out from a non-volatile semiconductor memory, on the basis of a previously recorded error correction count, and selects a data refresh processing or a substitute processing to perform. When the error is detected, the corrected data is rewritten back for preventing reoccurrence of error due to accidental cause. If it is determined that the reoccurrence frequency of the error is high and the error is due to degradation of the storage medium, based on the error correction count, the substitute processing is performed.

8 Claims, 7 Drawing Sheets

| ERROR OCURRENCE COUNT \ CORRECTION COUNT | 1 | 5 | 10 |
|---|---|---|---|
| 1 | REFRESH | REFRESH | SUBSTITUTION |
| 2 | REFRESH | SUBSTITUTION | SUBSTITUTION |
| 3 OR MORE | SUBSTITUTION | SUBSTITUTION | SUBSTITUTION |

STORAGE DEVICE COUNTING ERROR CORRECTION

This is a continuation of parent application Ser. No. 10/020,223, filed Dec. 18, 2001, issued as U.S. Pat. No. 6,480,416 and is con of application Ser. No. 09/662,926, filed Sep. 15, 2000, issued as U.S. Pat. No. 6,339,546.

This application claims a priority based on Japanese patent Application 11-263156 filed on Sep. 17, 1999, the entire contents of which are incorporated herein by reference for all purposes.

BACKGROUND OF THE INVENTION

The present invention relates to a storage device having a semiconductor memory as a storage medium, particularly to a storage device using an error correction code for improving reliability of stored data.

Rapid increase in kinds and amounts of information data with the development of information processing equipment has brought a remarkable development of storing devices. For accelerating expansion of storage capacity, efforts have been directed to technological developments for increasing storage densities of storage media. Nevertheless, when data is stored in a temporary storage medium, namely in a rewritable storage medium, the security of the stored data is not always assured because phase change of magnetic material or storage of electrical charges is utilized. The reliability of stored data is generally lowered as the storage density is increased.

In a storage device with a flash memory, for example, electrical charges stored in a storage element sometimes gradually leaks out to cause destruction of data. Therefore, almost all storage devices of such a kind are provided with data protection functions using error correction codes. In an external storage device used for a personal computer, an error correction code, which is similar to the one used in a magnetic disk drive and calculated using 512 byte data, are stored together with data. When read out, the stored data are checked for errors, the errors are corrected if errors are detected, and then stored data are outputted with the security thereof being increased.

In the above conventional magnetic storage device, no problem is caused by stochastically occurred errors, namely, errors that do not reoccur in the same location. However, in the storage device, no consideration is given for errors fixed to a certain location due to accidents inherent to a storage medium such as fatigue, damage, foreign matter sticking, and wire breaking in the storage medium. If such kinds of errors occur with negligibly small probabilities, there is no problem. However, such kinds of errors will accumulate when they occur with probabilities that are not negligible in the normal use. The error correction code is usually capable of correcting errors with a specified number of bits or in a specified area. However, if there occurs errors exceeding error correction capability of the code, the error can not be detected (miss detection), or wrong identification of an error location or an error pattern can be made to perform faulty correction of correct data (miss correction). Therefore, even if data is corrected when being outputted, the incorrect data left uncorrected on the storage medium causes another error that accumulates to exceed the capability of the error correction code, which results in making it impossible to recover the stored data. Only with a measure for increasing reliability by merely using error correction code, the foregoing problem will occur.

In addition, there can be another problem due to occurrences of two kinds of errors characteristic to the storage medium: an occurrence of data error due to degradation of the medium and that due to accidental causes. In a nonvolatile semiconductor memory, for example, degradation due to repetition of a rewriting cycle deteriorates data maintain characteristics to cause data error. Meanwhile, electric signal noises or radiation can cause stochastic data errors irrespective of the degradation. In this case, by rereading the data, correct data can be sometimes read, or by rewriting the data, correct data can be read thereafter. However, these two kinds of data errors can not be distinguished from each other by observing the data which are the results of the errors. In the case of the data error due to degradation, since it will accumulate in a area as described above, a substitute area must be provided for storing data and the degraded area must be made unusable without being left as it is to avoid accumulation of errors. In the case of the data error which is accidental and does not relate to degradation, since an area with such error can be brought normal state by rewriting the data, providing a substitute area and making the error area unusable is to lower the efficiency of the storage device. However, no measure has been taken for such a problem as above.

SUMMARY OF THE INVENTION

It is an object of the present invention to increase security of the data in a nonvolatile semiconductor storage device and to extend life of the nonvolatile semiconductor storage device by deciding whether the occurred data error is of accident or of reoccurrence due to degradation and carrying out the suitable processing.

In a nonvolatile semiconductor storage device according to the present invention, first, when a data error is detected in reproducing data from each block of a storage medium, which block is a unit of data access, error correction is carried out with the error correction count recorded for each area. Second, it is judged for each block whether the error correction count reaches a predetermined value or not. If the error correction count is less than the predetermined value, corrected data is rewritten in the same area. If the error correction count has reached the predetermined value, a substitute area is allocated to which the corrected data is transferred with the previously used area made unusable.

Moreover, with the degree of error correction divided into a plurality of grades, rewriting the data or allotting a substitute area is selected to be executed in accordance with the grade.

DESCRIPTION OF THE PREFERRED EMBODIMENTS

Embodiments of the present invention will be explained in the following with reference to drawings.

Figure 1:
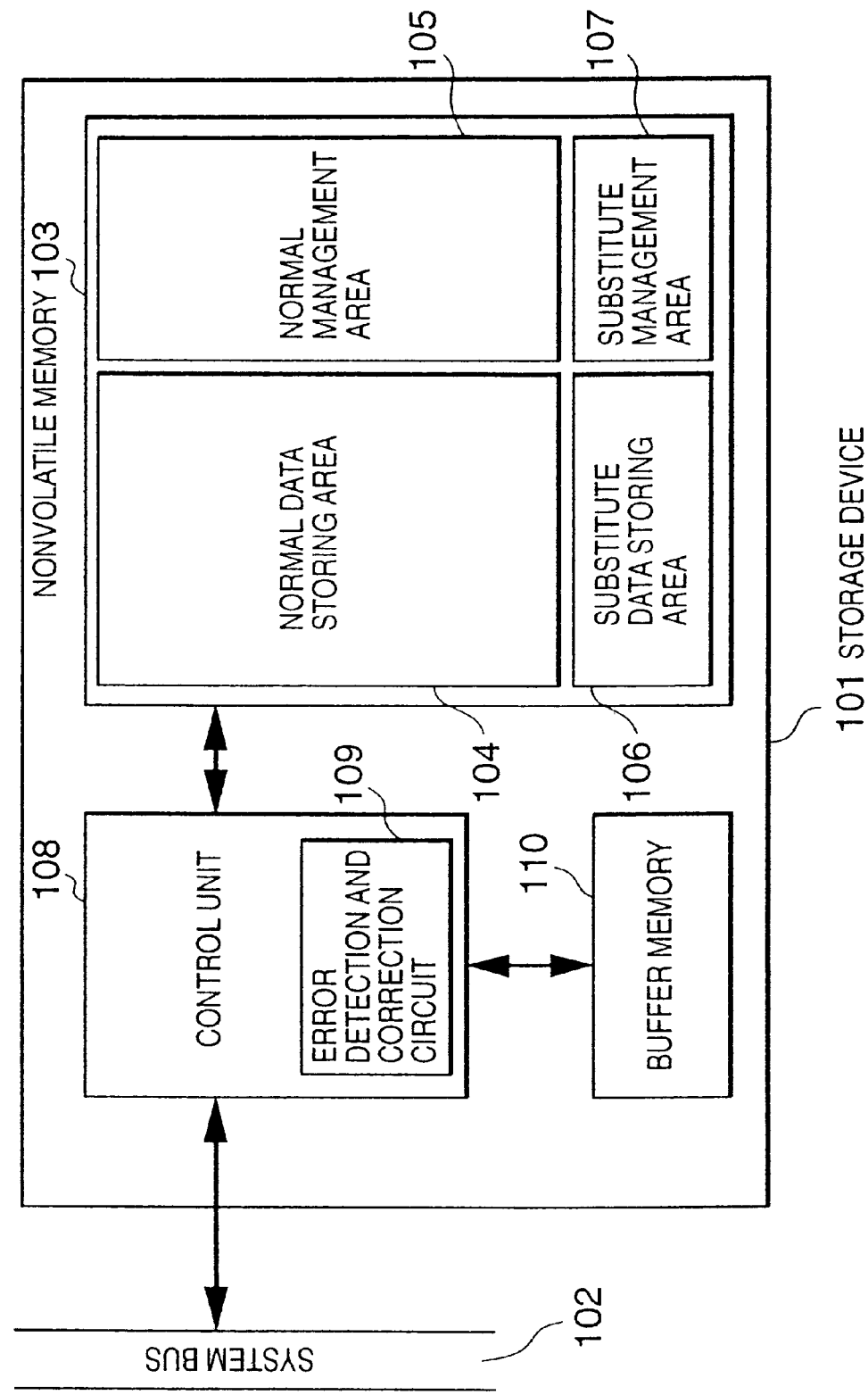
FIG. 1 is a schematic diagram showing a configuration of a storage device according to the present invention.

FIG. 1 is a schematic diagram showing a configuration of a semiconductor storage device, in particular, of a nonvolatile semiconductor storage device. The storage device 101 according to the present invention shown in FIG. 1 is connected to a system bus 102 of a host computer that makes a request to the storage device 101 for data reading and writing. A rewritable nonvolatile memory 103, which is a storage medium of the storage device 101 and can be in various forms such as a chip, module, and unit, includes a normal data storing area 104, a normal management area 105, a substitute data storing area 106, and a substitute management area 107. The normal data storing area 104, which is a normally used area, is divided into a plurality of blocks, each of which is a unit of data access. The divided block units of the normal data storing area 104 are managed by the normal management area 105 that stores management information of the normal data storing area. The substitute data storing area 106 is divided into a plurality of blocks, each of which is allocated for being substituted for a faulty block in the normal data storing area 104. The divided block units in the substituted data storing area 106 are managed by the substitute management area 107, in which there is stored management information for the substitute data storing area 106 (correspondence to the normal data storing area 104, error detection and correction codes of the substituted data, etc). That is, in the data storage device according to the present invention, the data storing areas are controlled in blocks, each of which is a unit of data access. The storage unit 101 further includes a control unit 108 for carrying out control inside the storage unit 101, an error detection and correction circuit 109 for the data stored in the nonvolatile memory 103, and a buffer memory 110 that temporarily stores data received from and transmitted to the system bus 102.

Next, an operation of the storage device 101 will be explained. The host computer requests the storage device 101 through the system bus 102 to store data or to read out stored data. The control unit 108 identifies a physical address in the nonvolatile memory 103 corresponding to a logical address indicated at the same time when the request is made by the host computer, and carries out a processing in accordance with a requested access.

Since the data storage device 101 according to the present invention excellently exhibits its effect at reading of the stored data, the read operation will be explained. When reading of a certain data is requested, the control unit 108 identifies a corresponding physical address of the requested data in the nonvolatile memory 103 and read out the data in the area corresponding to the physical address in the normal data storing area 104 and the management information in the corresponding area in the normal management area 105. Both of the data and management information being read out are inputted to the error detection and correction circuit 109 to be subjected to error detection, and are also stored into the buffer memory 110.

Figure 2:
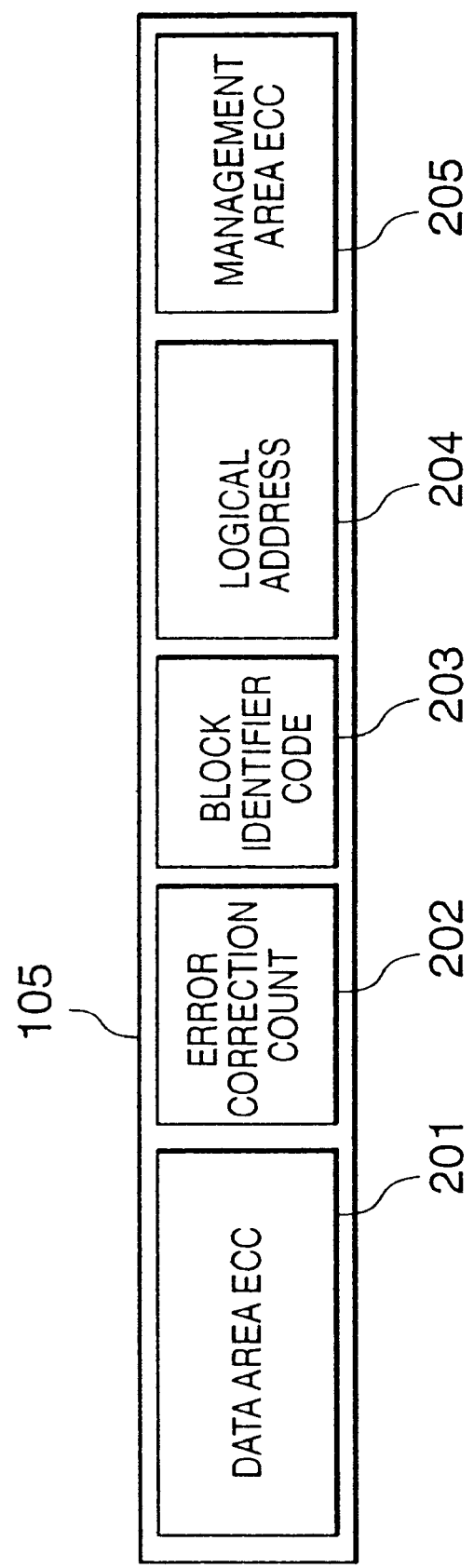
FIG. 2 is a schematic diagram showing an example of a management information.

FIG. 2 is a schematic diagram showing an example of contents of management information in the normal management area 105. A data area error detection and correction code (ECC) 201 for detecting and correcting an error or errors in a data area is obtained by inputting stored data in the error detection and correction circuit 109. If the result of the error detection indicates that error correction is required and possible, the error correction count 202 is recorded for each divided block in the corresponding data storing area. A block identifier code 203 indicates a content of a block. With the block identifier code 203, there are identified several kinds of blocks such as a usable block, unusable block, normal data block, substitute area block, and empty block. In an area 204, a logical address 204 is stored which is assigned by the host computer when the block is allocated. In an area 205, there is stored a management area error detection and correction code 205 for increasing the reliability of the management information itself.

The management information shown in FIG. 2 is stored in each block in the normal management area 105 and the substitute management area 107. All of the information are produced in the control unit 108 and stored into the corresponding locations in the normal management area 105 or the substitute management area 107. The control unit 108, on the basis of the information, identifies a physical storing location (physical address) of a read data requested by the host computer and reads out a corresponding location in the normal data storing area 104 for responding to the access request of the host computer.

When an error is detected in read out data in the read operation, a processing is carried out as explained below. The control unit 108 inputs the data read out from a specified block in the nonvolatile memory 103 into the error detection and correction circuit 109 together with the data area error detection and correction code 201 in the management information to detect presence or absence of an error in the data. When the presence of an error is detected, it is meant that there occurs an error of some kind in the nonvolatile memory 103. Although the error may be caused by a transmission error on some transmission line in the device, here, the error is taken as being caused by a failure of some kind in the nonvolatile memory 103. Data with an error should be reused if the error is due to an accidental cause and the data can be used without problem by rewriting it with the error being corrected. While, however, an error caused by degradation is anticipated to reoccur even if the data is rewritten with the error being corrected. Therefore, in the embodiment, after correcting the error, the data is rewritten for the present with an error correction count recorded to determine the cause of the error based on the error correction count.

Figure 3:
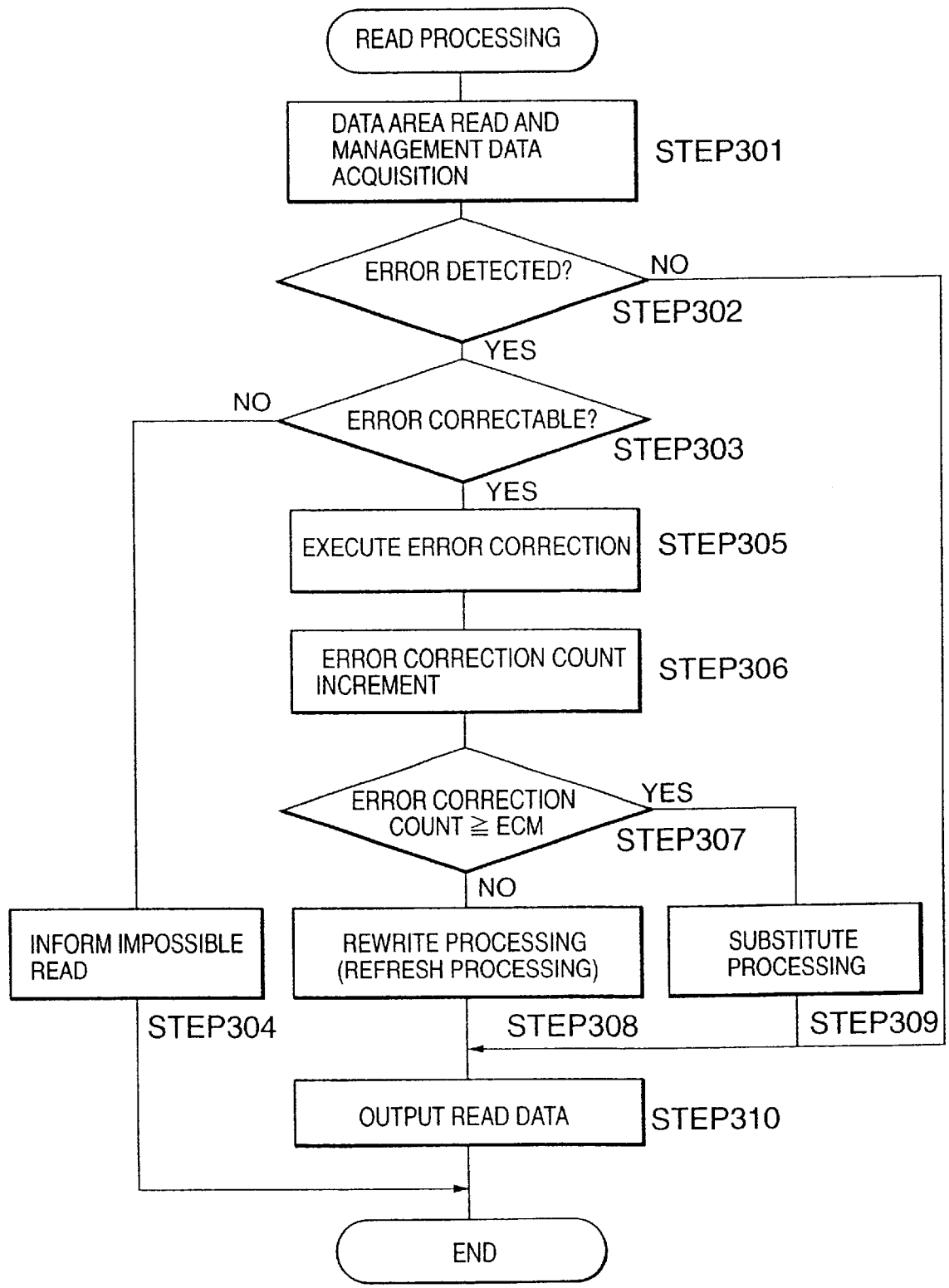
FIG. 3 is a flow chart showing a reading processing.

An operation procedure in a read processing is shown in a flow chart in FIG. 3. The flow chart is shown to be started from a step at which a read access is requested from the host computer through the system bus 102. The control unit 108 specifies a physical storage location to read data and management information (STEP 301). At this time, the read out data and the management information are inputted to the error detection and correction circuit 109, by which it can be ascertained whether an error has occurred or not (STEP 302). When no error has occurred in the data at this time, the data can be provided to the host computer as is read out, therefore the read out data is outputted (STEP 310). While, when an error is detected, a decision is made as to whether the error is correctable or not on the basis of the processing result of the error detection and correction circuit 109 (STEP 303). When there has occurred an uncorrectable error at this time, it is of no use to read out the data. Thus, it is informed to the host computer that the data can not be read out (STEP 304). When there has occurred the correctable error, the error correction is performed (STEP305) with an increment of the error correction count to update the management information (STEP 306).

Following this, the error correction count is compared with the error correct maximum value (ECM) (STEP 307). When the error correction count is less than ECM, the data area is determined to be still usable, and the corrected data is rewritten at the same location and the data area is continuously used (refresh processing, STEP 308). While, when the error correction count becomes equal to or more than ECM, it is determined that the data area is not usable any more and substitute processing is carried out (STEP 309). Namely, an unused block is selected from the substitute data storing area 106 to be allocated as a substitute area. At this time, it is necessary to prepare information indicating the correspondence of the substitute area and the normal data storing area 104 and to write the information in the corresponding location in the management information. On completion of the processing at STEP 308 or STEP 309, the corrected data is outputted to the host computer to complete the read processing (STEP 310).

Figures 4, 5:
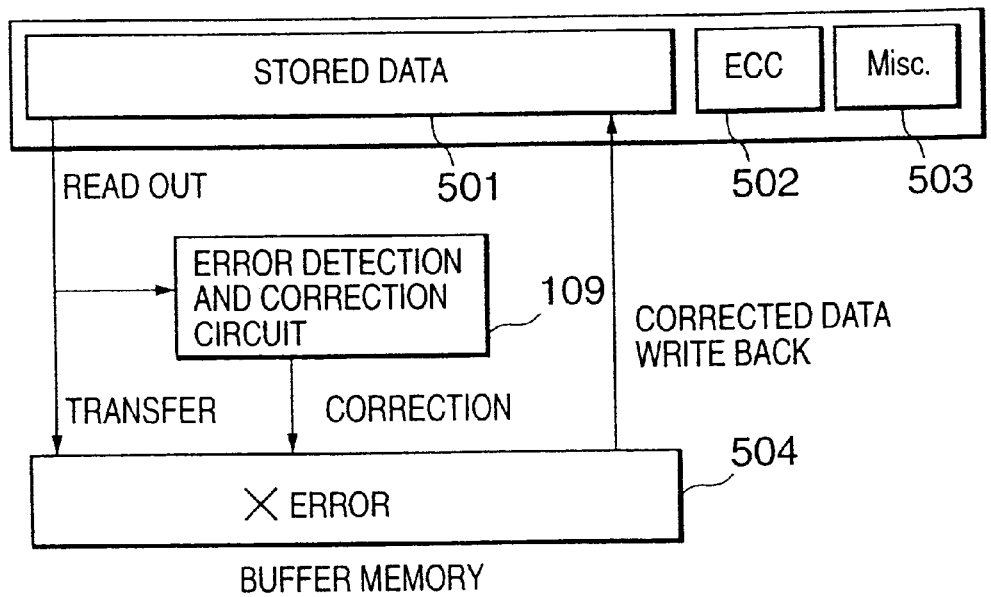
FIG. 4 is an example of a table for deciding whether a refreshing process is to be carried out or a substitute process is to be carried out.
FIG. 5 is a schematic diagram showing a data flow in a refresh processing.

In the above embodiment, switching between the rewriting processing and the substitute processing is carried out in accordance with the decision as to whether the error correction count exceeds the predetermined count (ECM) or not. In addition, as shown in FIG. 4, together with the error correction count, the error occurrence count in the data block can be taken as an additional factor in making such decision. There occurs not always one error in each data block, but a plurality of errors can occur at a time. A high count of error occurrence indicates that the block has a high possibility of being degraded or falling into a state in which the data correction is impossible. Therefore, such a block may be better subjected to the substitute processing in an earlier stage. The table in FIG. 4 indicates that when many errors occur, the substitute processing is carried out despite small error correction count. In this case, an error occurrence count is also recorded in the error correction count 202 shown in FIG. 2 together with the correction count. Along with this, at STEP 307 in FIG. 3, a decision is made on the basis of the table shown in FIG. 4 as to whether the refresh processing or the substitute processing is to be carried out.

Figure 6:
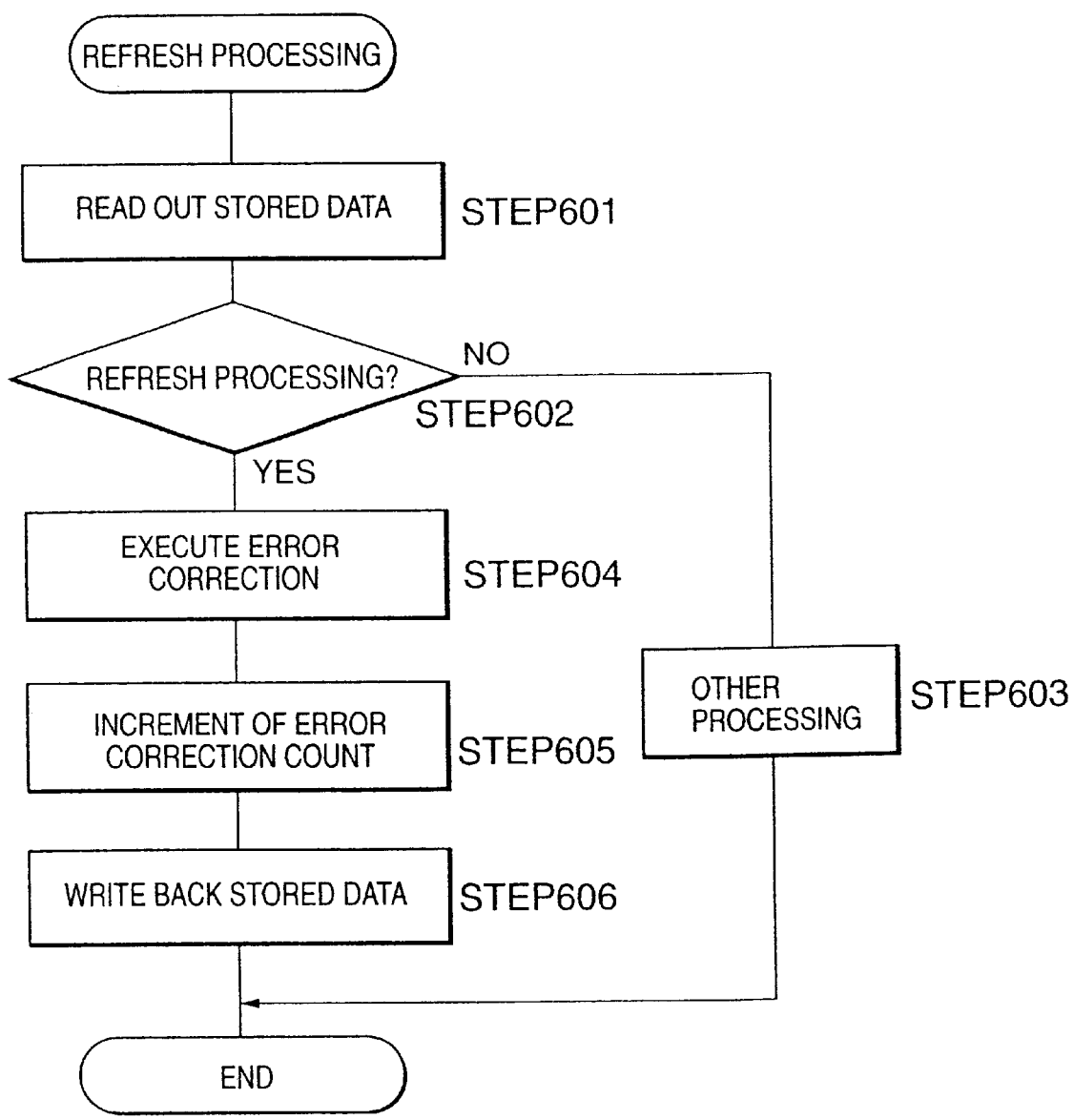
FIG. 6 is a flow chart showing an operation of the refresh processing.

FIG. 5 is a schematic diagram illustrating a data flow in a data rewriting operation in the refresh processing, and FIG. 6 is a flow chart showing the data rewriting operation in the refresh processing. An area 501 is a stored data section of a certain block in the normal data area. An area 502 is for an error detection and correction code (ECC) of the stored data. An area 503 is for miscellaneous management information, an example of which is shown in FIG. 2. An area 504 is a buffer memory for temporarily storing the read out stored data. The read out stored data 501 is inputted to the error detection and correction circuit 109 and at the same time, stored in the buffer memory 504 (STEP 601).

At this time, the ECC 502 is also inputted to the error detection and correction circuit 109 to carry out the error detection. When any error is detected, decision is made, on the basis of the number of errors and/or the error correction count as shown in FIG. 4, as to whether the data rewrite processing (refresh processing) is to be executed or not (STEP 602). When it is decided that no refresh processing is to be executed, other processing is carried out to complete the processing (STEP 603). While, when it is decided that the refresh processing is to be executed, the error detection and correction circuit 109 is further operated to identify the error location and the error pattern to execute error correction on the buffer memory 110 (STEP 604). Next to this, an increment of the error correction count is carried out (STEP 605) with the stored data written back in the same location (STEP 606). The foregoing operation is different from that in the previously explained processing in the order of carrying out the processing. However, since there is no problem in obtaining a required effect, the order can be changed as it fits.

Figure 7:
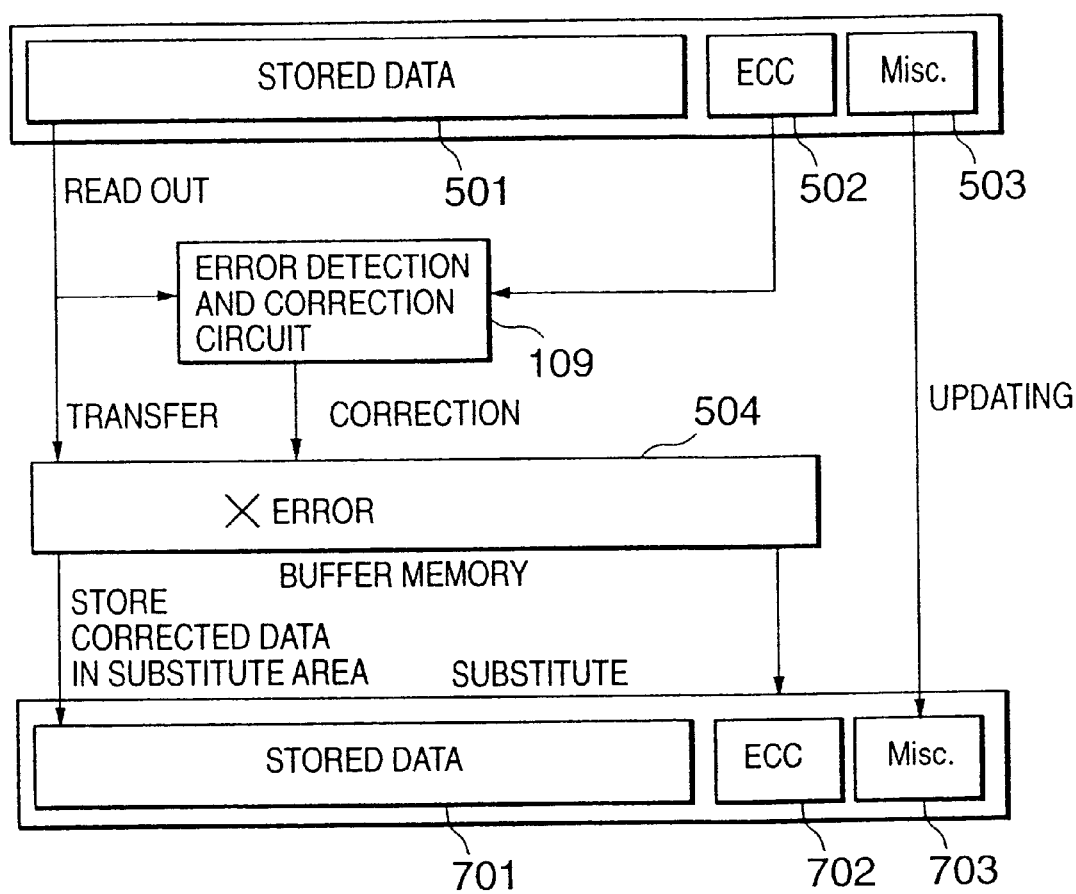
FIG. 7 is a schematic diagram showing a data flow in a substitute processing.

FIG. 7 is a schematic diagram illustrating a data flow in the substitute processing in which an operation of data correction is the same as that in the refresh processing illustrated in FIG. 5 with further operation carried out thereafter for storing the corrected data in another selected block 701. At this time, since the stored data is not modified, the ECC 502 is to be the same. Therefore, the ECC 502 is written as it is as an ECC 702 when there occurs no error therein. While, when there occurs any error in the ECC 502, it is to be written as the ECC 702 with the error corrected. In addition, miscellaneous information 503 (management information other than ECC) is to be written with necessary updating.

Figure 8:
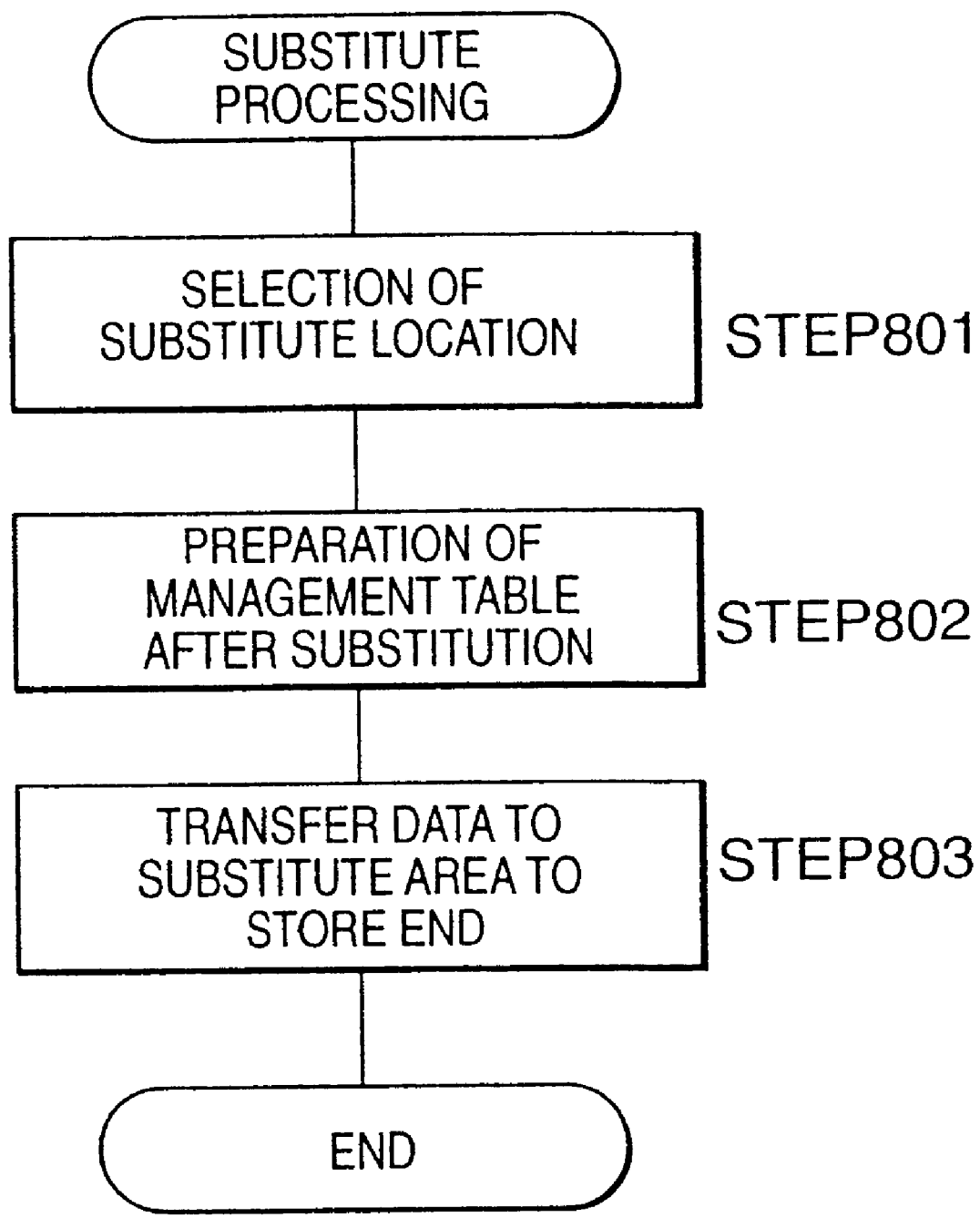
FIG. 8 is a flow chart showing the substitute processing.

An entire flow of the substitute processing is shown as a flow chart in FIG. 8. The substitute processing shown in FIG. 8 is executed at STEP 309 in the flow chart shown in FIG. 3. At first, at STEP 801, there is carried out a selection of a substitute block for the corrected data. Of various possible ways of selecting the substitute block, that of using blocks in order in an area specialized for substitution provided beforehand (for example, the substitute data storing area 106 shown in FIG. 1) may be most easily managed with a short selection time. Other possible ways are such ones as selecting a block with smaller degradation, and using a block predetermined so as to correspond to the block to be substituted.

Following this, at STEP 802, updating of a management table is carried out which becomes necessary by a change in the correspondence between the logical address and physical address of the block due to the substitution. The management table is the one such as an address translation table for translating a logical address (an address specified by the host computer in accessing) into a physical address on a memory. It is indispensable to a storage device that carries out substitution. The management table can be managed in various ways. The present embodiments store the whole management table in a specified location (for example, the substitute management area 107 in FIG. 1) on the nonvolatile memory for facilitating management and updating. On completion of the updating, the data is transferred to the substitute block and stored in the block at STEP 803. Since the corrected data is stored in the buffer memory, the stored corrected data is then transferred to the substitute data storing area. The ECC data and the management information are processed as previously described. Thus, the substitute processing is completed.

According to the present invention, it is decided whether the substitute processing is to be executed or not by determining whether an error occurrence is due to accident or due to degradation that causes frequent occurrence of the error. Therefore, the substitute processing can be executed less frequently to make it possible to reduce unnecessary use of the substitute area. Moreover, with the rewriting of the data, the cell status can be made more stable in the one where data error occurred as well as the one where the error is not occurred yet, so that the data can be stored with increased reliability. Furthermore, in addition to the error correction count, the error occurrence count also can be taken as an additional factor of the above decision to allow a practical and fine control.

While the present invention has been particularly shown and described with reference to preferred embodiments thereof, it will be understood by those skilled in the art that the foregoing and other changes in form and details can be made therein without departing from the spirit and scope of the present invention.

What is claimed is:

1. A storage apparatus to be coupled with a system bus for receiving a write request accompanied with data through said system bus from a host system comprising:

a nonvolatile flash semiconductor memory comprising a plurality of memory blocks and a management area, and a controller unit which is coupled with said system bus and said nonvolatile flash semiconductor memory, and which carries out error detection and correction operations with respect to read data from one of said plurality of memory blocks of said nonvolatile flash semiconductor memory;

wherein said controller unit keeps count of the error correction operation of the read data for each block to determine whether the count reaches a predetermined value and if it determines that the count of the error correction operation has not yet reached said value, the control unit carries out a recording operation of data after the error correction operation in the same memory block of said plurality of memory blocks.

2. A storage apparatus according to claim 1, wherein said controller unit carries out a recording operation of the data after the error correction in a different memory block of said plurality of memory blocks, if the unit determines that the count of the error correction operation has reached said value.

3. A storage apparatus according to claim 2, wherein said controller unit carries out a recording operation of the count of the error correction operation of the read data in said management area.

4. A storage apparatus according to claim 1, wherein said controller unit keeps count of error occurrence in one operation of the error detection and correction of said read data to determine whether the count of the error occurrence has reached a predetermined value or not and if it determines that the count of the error occurrence has not yet reached the value, the controller unit carries out a recording operation of the data after error correction operation in the same memory block of said plurality of memory blocks.

5. A storage apparatus according to claim 4, wherein said controller unit carries out a recording operation of the data after the error correction operation in a different memory block of said plurality of memory blocks, if the unit determines that the count of the error correction operation has reached said value.

6. A storage apparatus to be coupled with a system bus for receiving a write request accompanied with data through said system bus from a host system comprising:

a nonvolatile flash semiconductor memory comprising a plurality of memory blocks and a management area, and a controller unit which is coupled with said system bus and said nonvolatile flash semiconductor memory, and which carries out error detection and correction operations with respect to read data from one of said plurality of memory blocks of said nonvolatile flash semiconductor memory;

wherein said controller unit keeps count of error occurrence in one operation of the error detection and correction of the read data to determine whether the count reaches a predetermined value and if it determines that the count of the error occurrence has not yet reached said value, the controller unit carries out a recording operation of data after the error correction operation in the same memory block of said plurality of memory blocks.

7. A storage apparatus according to claim 6, wherein said controller unit carries out a reading operation of the data after the error correction operation in a different memory block of said memory blocks, if the unit determines that the count of the error occurrence has reached said value.

8. A storage apparatus according to claim 7, wherein said value is 3.

* * * * *